United States Patent [19]
Dutta et al.

[11] Patent Number: 5,550,089
[45] Date of Patent: * Aug. 27, 1996

[54] GALLIUM OXIDE COATINGS FOR OPTOELECTRONIC DEVICES USING ELECTRON BEAM EVAPORATION OF A HIGH PURITY SINGLE CRYSTAL $GD_3GA_5O_{12}$ SOURCE.

[75] Inventors: Niloy K. Dutta, Colonia; Russell J. Fischer, Berkeley Heights; Neil E. J. Hunt, Scotch Plains; Matthias Passlack; Erdmann F. Schubert, both of New Providence; George J. Zydzik, Columbia, all of N.J.

[73] Assignee: Lucent Technologies Inc., Murray Hill, N.J.

[*] Notice: The portion of the term of this patent subsequent to Mar. 23, 2014, has been disclaimed.

[21] Appl. No.: 217,332

[22] Filed: Mar. 23, 1994

[51] Int. Cl.$^6$ .......................... H01L 21/00; H01L 21/02; H01L 21/302; H01L 21/463
[52] U.S. Cl. .............. 437/225; 437/228; 437/236
[58] Field of Search .................. 437/225, 228, 437/235, 236, 237

[56] References Cited

U.S. PATENT DOCUMENTS 4,617,192  10/1986  Chin et al. ................... 427/567
4,749,255   7/1988  Chakrabarti et al. ............ 372/45

OTHER PUBLICATIONS

M. Fleischer, "Stability of Semiconducting Gallium Oxide-Thin Films," Thin Solid Films, 190 (1990), pp. 93–102.
A. Callegari, et al, "Unpinned Gallium Oxide/GaAs Interface by Hydrogen and Nitrogen Surface Plasma Treatment", Appl Phys Lett, 454(4) 23 Jan. 89, pp.332–334.
S. M. Sze, Physics of Semiconductor Devices, 2nd Ed., pp. 366–369.
L. M. Terman, "An Investigation of Surface States at a Silicon/Silicon Oxide Interface Employing Metal–Oxide–Silicon Diodes," Solid State Electronics, vol. 5, Sep.–Oct. 1962, pp. 285–299.

Primary Examiner—R. Bruce Breneman
Assistant Examiner—Byron Everhart
Attorney, Agent, or Firm—Oleg E. Alber

[57] ABSTRACT

An optoelectronic III-V or II-VI semiconductor device comprises a thin film coating with optical characteristics providing low midgap interface state density. A field effect device for inversion channel applications on III-V semiconductors also comprises a thin dielectric film providing required interface characteristics. The thin film is also applicable to passivation of states on exposed surfaces of electronic III-V devices. The thin film comprises a uniform, homogeneous, dense, stoichiometric gallium oxide ($Ga_2O_3$) dielectric thin film, fabricated by electron-beam evaporation of a single crystal, high purity $Gd_3$ $Ga_5O_{12}$ complex compound on semiconductor substrates kept at temperatures ranging from 40° to 370° C. and at background pressures at or above $1 \times 10^{-10}$ Torr.

16 Claims, 4 Drawing Sheets

GALLIUM OXIDE COATINGS FOR OPTOELECTRONIC DEVICES USING ELECTRON BEAM EVAPORATION OF A HIGH PURITY SINGLE CRYSTAL $GD_3GA_5O_{12}$ SOURCE.

TECHNICAL FIELD

This invention concerns electronic and optoelectronic devices provided with a gallium oxide coating for improved performance.

BACKGROUND OF THE INVENTION

Dielectric coatings play an important role in achieving desired performance of III—V or II—VI semiconductor optoelectronic devices. Dense, closely packed thin films are required to protect the surface, such as light emitting or receiving facets, of optoelectronic devices from contamination and oxidation. Antireflection coatings (AR) are required on light emitting or receiving facets to increase the quantum efficiency of optoelectronic devices. Dielectric thin films providing low midgap interface state density are required, in particular on light emitting facets, to minimize nonradiative energy-dissipating processes such as carrier recombination via interface states. Carrier recombination is known to trigger a process at laser facets called thermal runaway causing device failure especially when operated at high optical power. Inversion channel field effect devices require dielectric films providing an unpinned Fermi level and low density of interface states below midgap (p-channel device) or above midgap (n-channel device) at the dielectric/semiconductor interface. Further, hysteresis-free capacitance-voltage characteristics with excellent reproducibility of flatband voltage, small flatband voltage shift, and small frequency dispersion are required. Also, passivation of states on exposed surfaces of electronic III-V devices require low density of midgap interface states.

A variety of materials has been proposed for such layers including $ZrO_2$, $Al_2O_3$, $SiO_x$, $SiN_x$, $SiN_xO_y$, $Y_2O_3$ stabilized $ZrO_2$, borosilicate glass and gallium oxide. The $SiO_2$ and $SiN_x$ layers are usually deposited by sputtering, which can cause damage to the semiconductor surface. Electron-beam deposition of coatings such as $Al_2O_3$ or $ZrO_2$ requires addition of oxygen to get the proper stoichiometry for a desired refractive index. This requirement makes it difficult to form the layer reproducibly.

$Al_2O_3$, $SiO_x$, $SiN_x$, $SiN_xO_y$, and borosilicate glass layers are fabricated with dielectric properties, but exhibit a pinned Fermi level near midgap with a midgap state density above $10^{13} cm^{-2} eV^{-1}$ when deposited on bare III-V semiconductor layers. The midgap interface state density is in a range between $7\times10^{11} cm^{-2} eV^{-1}$ and $10^{13} cm^{-2} eV^{-1}$ when deposited on GaAs samples previously treated by liquid or dry surface passivation techniques. The long term stability of liquid passivated semiconductor/dielectric interfaces under thermal stress has yet not been investigated. Furthermore, large hysteresis (at least a few volts), nonreproducible flatband voltage shifts (at least a few volts), large frequency dispersion of capacitance, and high interface state densities closer to valence or conduction band edge, did not yet allow fabrication of inversion channel field effect devices on III-V semiconductor devices. On the other hand, gallium oxide thin films deposited in an oxygen radio frequency plasma in a vacuum system, in conjunction with a GaAs surface previously treated by $H_2$ and $N_2$ plasma, gives dielectric/GaAs interfaces with midgap density of states well below $10^{11} cm^{-2} eV^{-1}$. The realization of inversion channel field effect devices has been prevented in this case by large hysteresis ($\geq 2$ V), nonreproducible flatband voltage shift (between 2 and 10 V) and leaky gallium oxide films.

It is therefore an object of the invention to provide a proper coating for protection and optical anti-reflection providing low density of midgap interface states when deposited on bare III-V semiconductor surfaces, in particular on light emitting facets for improved device reliability. It is another object of the invention to provide a dielectric thin film in field effect devices for inversion channel applications on III-V semiconducting substrates.

SUMMARY OF THE INVENTION

The invention embodies an optoelectronic III-V or II-VI semiconductor device comprising a thin film coating with proper optical characteristics providing a low midgap interface state density. The invention further embodies a field effect device for inversion channel applications on III-V or II-VI semiconductors comprising a thin dielectric film providing required interface characteristics. A part of the device structure is also applicable to passivation of states on exposed surfaces of electronic III-V devices. The thin film comprises a uniform, homogeneous, dense, stoichiometric gallium oxide ($Ga_2O_3$) dielectric thin film, fabricated by electron-beam evaporation of a single crystal, high purity $Gd_3Ga_5O_{12}$ complex compound on substrates kept at a temperature within a range of from 40° to 370° C. and at background pressures at or above $1\times10^{-10}$ Torr.

It will be appreciated that, for purposes of illustration, these figures are not necessarily drawn to scale.

DETAILED DESCRIPTION OF THE INVENTION

Figure 1:
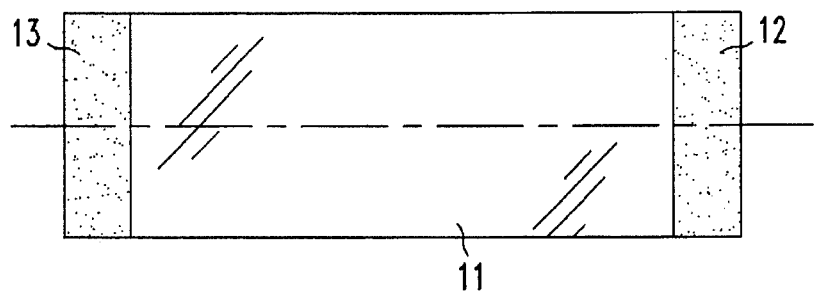
FIG. 1 is a side schematic view of a III-V or II-VI semiconductor device in accordance with an aspect of one embodiment of the invention.

A semiconductor device embodying one aspect of the invention is schematically represented in FIG. 1. The device, 10, can be any III-V or II-VI laser, light-emitting diode or photodetector. This laser could be a GaAs-based distributed feedback (DFB) laser, channeled-substrate buried heterostructure (CSBH) laser or a ridge waveguide quantum well laser. Such structures are well known in the art and, consequently, are not shown or discussed in detail.

In an exemplary embodiment, device 10 is a ridge waveguide quantum well laser. Formed on one mirror facet of semiconductor laser body, 11, is a coating, 12, which in this example is an anti-reflection (AR) coating having a thickness of about $\lambda/4n$ or odd multiple thereof, where $\lambda$ is the wavelength of emitted light and n is the index of refraction of the coating. In the case of a photodetector device, $\lambda$ would be the wavelength of the received light. On the other facet is a highly reflective coating (HR), 13, of a suitable material such as alternate layers of Si and $Ga_2O_3$. As a result of these two coatings, the laser is capable of emitting a higher power beam from the AR-coated facet than would be the case of an uncoated facet. In a ridge waveguide laser, a residual reflectivity of from 1 to 10 percent is desirable on the AR coated facet. If the laser is of a DFB type, the AR coating will also suppress the normal Fabry-Perot modes of the laser cavity so that a single longitudinal mode emission is produced. In systems where the laser is optically pumped, both laser facets could be coated with the AR layer so that a laser amplifier is produced. $Ga_2O_3$ layer 12 can also act as a coating which does not change the reflectivity if the thickness is deposited as an even multiple of $\lambda/2n$. Such a coating is called a passivation coating. In such cases, both facets are coated, and the layer serves to prevent degradation of the facets which might occur due to operation at high optical powers or the application of higher than normal current pulses.

In accordance with a main feature of the invention, the coating, whether used as an AR, HR or passivation layer, comprises stoichiometric $Ga_2O_3$ deposited by electron beam evaporation. High quality, dielectric $Ga_2O_3$ thin films are deposited by a technique using electron beam evaporation of a single crystal high purity $Gd_3Ga_5O_{12}$ source. The electron beam deposition is generally conducted in accordance with known techniques. See for example U.S. Pat. No. 4,749,255, which is incorporated herein by reference. The source material is provided within a standard or noble crucible contained in an evacuated evaporation chamber. Also included within the evaporation chamber are a source of electrons and a holder for supporting at least one semiconductor body facets of which are to be coated. The beam of electrons is directed to the source material to cause evaporation of the material and deposition on the to be coated surfaces. Electron beam evaporation provides no significant damages to the semiconductor surface and permits in-situ monitoring of the layer thickness.

In a particular example, a number of ridge waveguide lasers with a InGaAs/GaAs structure, which comprise InGaAs active regions emitting light at 0.98 µm, were placed into the vacuum chamber of the evaporating apparatus. The surfaces of the lasers, other than the mirror facets to be coated with $Ga_2O_3$, where covered by a mask, such as stainless steel or resist. The source for the layer to be evaporated was placed in a crucible adjacent to the filament so that an electron beam emitted by the filament would impinge on the source. The pressure in the chamber is typically at or above $1'10^{-10}$ Torr.

Electron bombardment of the source material was initiated and continued until a layer of a desired thickness was evaporated onto the laser facet (or facets). Depending whether the facet coating was to be used as an AR, HR or passivating coating, the evaporated thickness is adjusted in accordance with the desired purpose. Thickness was monitored by a quartz crystal oscillator.

The facet coatings were deposited at the opposite ends of body 11 by a process for depositing gallium oxide film disclosed in the copending U.S. application Ser. No. 08/217, 296 filed on Mar. 23, 1994 (Hunt, N.E.J. et at Case 5-1-24-38), which is incorporated herein by reference. The facet coatings were deposited by electron beam evaporation of $Ga_2O_3$ using a single crystal high purity $Gd_3Ga_5O_{12}$ source. This source combines the relatively covalent oxide $Ga_2O_3$, which volatilizes near 2000K, and the pretransition oxide $Gd_2O_3$ which has a boiling point (>4000K) well above the forgoing temperature. The more complex compound $Gd_3Ga_5O_{12}$ (melting point~2000K) decrepitates during heating, slowly releasing high purity $Ga_2O_3$. The background pressure in the evaporation chamber (no bleeding in of $O_2$) was $1-2\times10^{-6}$ Torr. Background pressures as low as $1\times10^{-10}$ or $1\times10^{-11}$ are possible. The deposition rate, which was maintained at 0.05 nm/s, and the film thickness were measured during deposition by a crystal thickness monitor.

Using this method, the facets of ridge-waveguide $In_{0.2}Ga_{0.8}As/GaAs$ quantum well lasers were coated with high quality $Ga_2O_3$ films. The so-deposited laser facet coatings exhibited low interface state densities. The deposited $Ga_2O_3$ films show an excellent homogeneity. This was demonstrated by Auger depth profiling as described in the above-identified copending U.S. application. The measurements also show, within the limits of Auger spectroscopy, that the films are stoichiometric. No impurities could be detected by Auger analysis (sensitivity 0.1%) including Gd, which is considered to be the dominant impurity in our $Ga_2O_3$ films. The Gd content estimated by SIMS was of the order of 0.1%.

Optical and electrical properties of $Ga_2O_3$ films were determined before these films were used for coating laser facets. For this purpose, homogeneous, high quality dielectric $Ga_2O_3$ films with thicknesses between 4 and 400 nm were deposited a) on Si wafers covered by a 90 nm thick TiW layer, b) on n+GaAs substrates, and c) on fused silica in order to determine electrical and optical properties of these films. Subsequently, laser facets were coated at substrate temperatures $T_S$ of below 50° C., such as 40° C. with no excess oxygen, and below 150° C., such as 125° C., with an oxygen partial pressure of $p_{ox}=2\times10^{-4}$ Torr in the evaporation chamber. The index of refraction was determined by reflection, transmission, and ellipsometry measurements. The transmission of $Ga_2O_3$ films on fused silica samples was measured by a tungsten halogen lamp in conjunction with a monochronometer. Reflectivity measurements were made using an Anritsu optical spectrum analyzer MS9001B1 and a tungsten halogen lamp. The wavelength was scanned between 0.6 and 1.2 µm and the results of both transmission and reflection measurements were subsequently fitted to a theoretical model for an absorbing dielectric film.

In a particular example, GaAs based ridge waveguide lasers structures emitting at 980 nm were investigated. The exemplary ridge waveguide laser comprises an 80 Å thick $In_{0.2}Ga_{0.8}As$ quantum well active region, 0.1 µm thick undoped GaAs optical confinement layers, and 1.2 µm thick $Ga_{0.5}In_{0.5}P$ cladding layers. The calculated reflectivity, R, of an abrupt transition of two media with refractive index $n_1$ (air) and $n_3$ (III-V semiconducting material), respectively, separated by an anti-reflection coating with refractive index $n_2$ and a thickness of $\lambda/4n_2$, or odd multiple thereof, is given by $$R = \left[ \frac{n_1 n_3 - n_2^2}{n_1 n_3 + n_2^2} \right]^2.$$

According to foregoing equation, anti-reflection coatings (zero reflectivity) are provided by a facet coating with $n_2$=1.88, 1.80, and 1.89 on GaAs, $Ga_{0.5}In_{0.5}P$, and $In_{0.2}Ga_{0.8}As$, respectively, at 980 nm wavelength.

Figure 2:
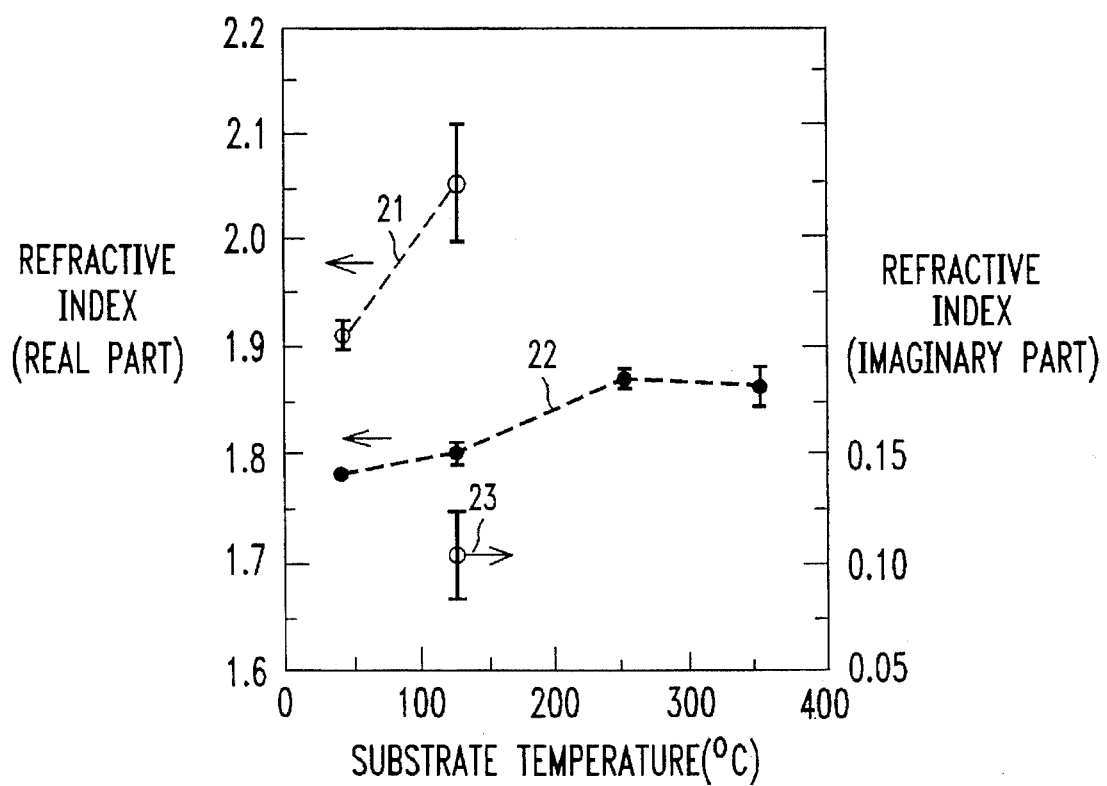
FIG. 2 is a plot of an index of refraction versus substrate temperature during deposition of $Ga_2O_3$ films.

FIG. 2 is a plot of refractive index vs. substrate temperature during deposition for $Ga_2O_3$ films deposited at a background pressure of $1$–$2 \times 10^{-6}$ Torr with no excess oxygen (Curve 21) and with $2 \times 10^{-4}$ Torr oxygen present (Curve 22) in the evaporation chamber. The refractive indices of $Ga_2O_3$ films deposited with $2 \times 10^{-4}$ Torr oxygen present in the evaporation chamber are 1.78, 1.80, 1.87, and 1.87 for substrate temperatures during deposition, $T_s$, of 40°, 125°, 250°, and 370° C., respectively. $Ga_2O_3$ films deposited at a background pressure of $1$–$2 \times 10^{-6}$ Torr with no excess oxygen show a refractive index of 1.91 when deposited at a substrate temperature of 40° C. and the refractive index is complex (2.06+i0.1) when deposited at 125° C. substrate temperature. Thus, over a wide range of deposition conditions, $Ga_2O_3$ coatings deposited by said method of fabrication, provide required refractive indices. Imaginary part of the reflective index is represented by the measurement point, 23, in FIG. 2.

Figure 3:
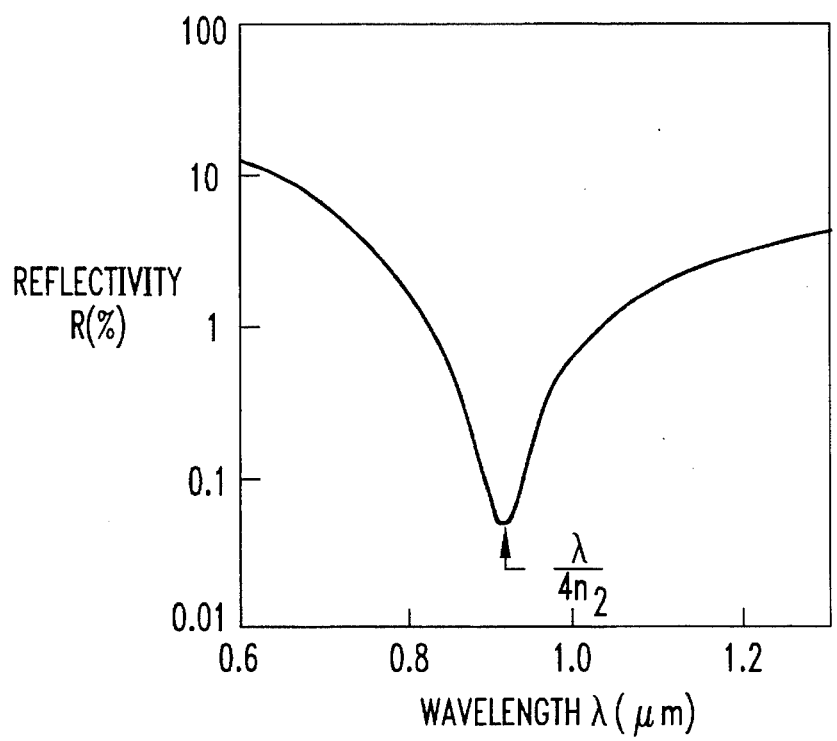
FIG. 3 is a plot of reflectivity as a function of wavelength of a 125 nm thick $Ga_2O_3$ film on GaAs.

By way of an example only, the reflectivity of a 1250 Å thick $Ga_2O_3$ layer, deposited on a GaAs substrate maintained during deposition at 125° C. with $O_2$ partial pressure of $2 \times 10^{-4}$ Torr in the evaporation chamber, was also investigated. FIG. 3 shows the corresponding plot of reflectivity vs. wavelength. Since ridge waveguide lasers require low reflectivity coatings, the thickness of the $Ga_2O_3$ coating was designed to yield a reflectivity of 0.5% at 980 nm wavelength. The minimum reflectivity is 0.05% at 907 nm wavelength with a refractive index of 1.80 of the $Ga_2O_3$ coating. Minimum reflexivities of 0.03% were measured on other samples.

Figure 4:
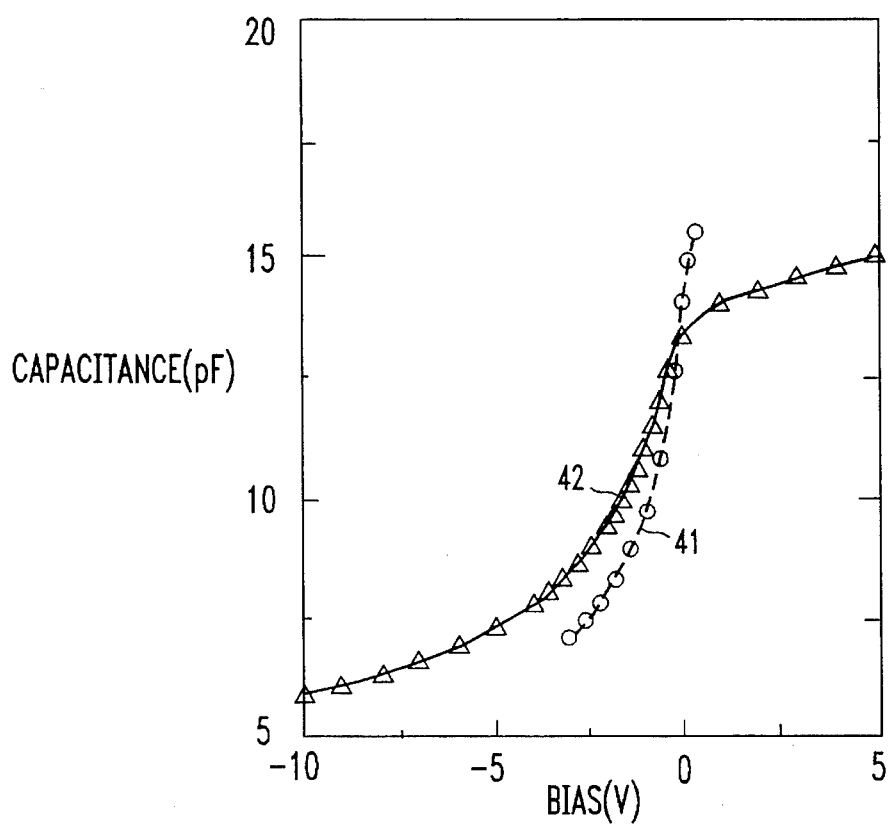
FIG. 4 is a plot of high-frequency capacitance vs. bias for Au/Ti/$Ga_2O_3$/n-type GasAs (Curve 41) and Au/Ti/$Ga_2O_3$/n-type$Ga_{0.5}P$ (Curve 42) metal/insulator/semiconductor structures measured at 300K.

FIG. 4 shows a plot of high-frequency capacitance vs. bias for Au/Ti/$Ga_2O_3$/n-type GaAs (Curve 41) and for Au/Ti/$Ga_2O_3$/n-type $Ga_{0.5}In_{0.5}P$ (Curve 42) metal/insulator/semiconductor structures measured at 300K. The $Ga_2O_3$ films were deposited on bare substrates at substrate temperatures of 350° C. (Curve 41) and 125° C. (Curve 42) and with $2 \times 10^{-4}$ Torr oxygen present in the evaporation chamber. The capacitance characteristics measured at a frequency of 1 MHz at 300K, reveal an unpinned Fermi level and a midgap interface state density of about $10^{12} cm^{-2} eV^{-1}$ and below $10^{11} cm^{-2} eV^{-1}$ at Ga/As/$Ga_2O_3$ and $Ga_{0.5}P$/$Ga_2O_3$ semiconductor/dielectric interfaces, respectively. Since the interface recombination velocity is directly proportional to the midgap interface state density, energy dissipating processes such as recombination via interface states are reduced by one to two orders of magnitude compared to other coatings deposited on bare samples.

Further, an indirect measure of interface recombination velocity are measurements of photoluminescence intensity. The $Ga_2O_3$ coatings on bare GaAs and bare $Ga_{0.5}In_{0.5}P$ substrates deposited at substrate temperatures of 350° C. and 125° C., respectively, and with $2 \times 10^{-4}$ Torr oxygen present in the evaporation chamber, lead to an increase in photoluminescence intensity by a factor of 1.4 to 1.7 compared to identical uncoated samples. Other coatings such as $Al_2O_3$, $SiO_x$, $SiN_x$, $ZrO_2$ and $Y_2O_3$ stabilized $ZrO_2$, deposited on bare GaAs samples, do not cause an increase in photoluminescence intensity compared to uncoated GaAs samples.

Figure 5:
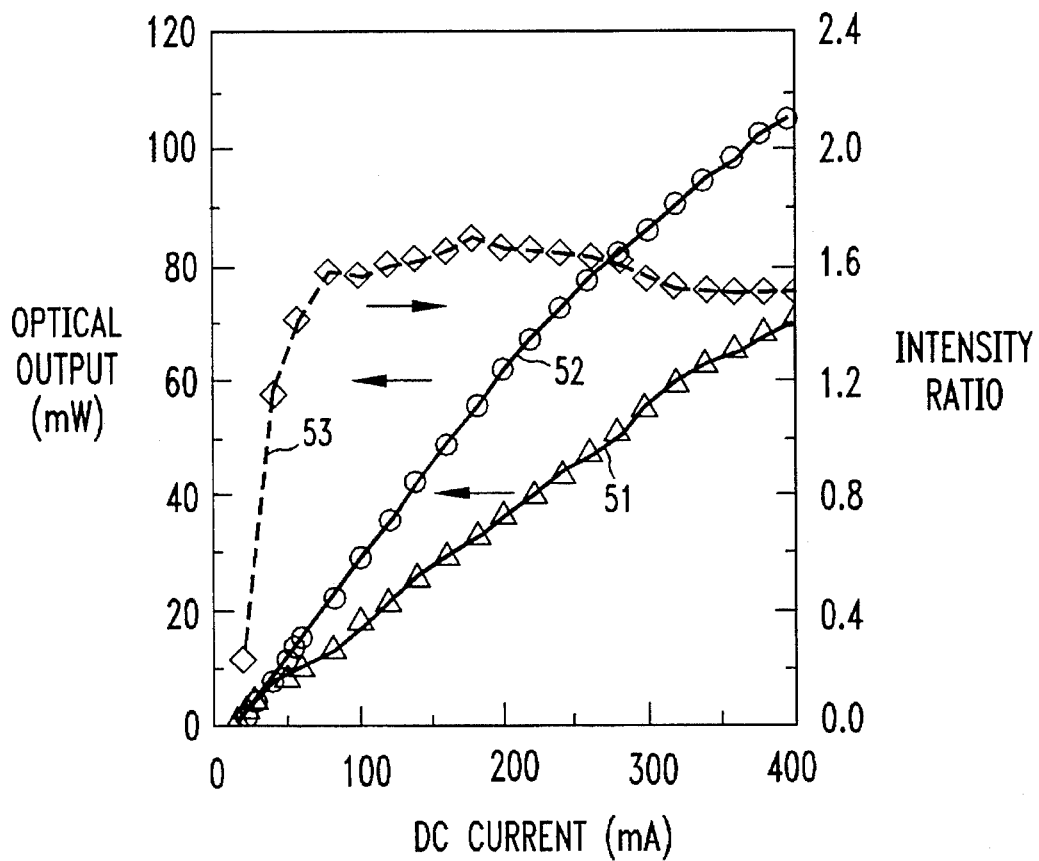
FIG. 5 is a plot of the optical output as a function of dc current for a ridge waveguide $In_{0.2}Ga_{0.8}As$/GaAs quantum well laser emitting at 0.98 μm before (Curve 51) and after (Curve 52) facet coating.

FIG. 5 shows a plot of the optical output as a function of dc current for a ridge-waveguide $In_{0.2}Ga_{0.8}As$/GaAs quantum well laser emitting at 0.98 μm before (Curve 51) and after (Curve 52) facet coating. The ridge of this laser is 5 μm wide and 500 μm long. The facets of the laser were coated with $Ga_2O_3$ films deposited at substrate temperatures of 125° C. with an oxygen partial presure of $2 \times 10^{-4}$ Torr in the evaporation chamber. Prior to film deposition, the laser facets were cleaned by ethyl alcohol. The thickness of the front facet coating was 125 nm, which gives a measured and calculated reflectivity of 0.5% and 0.75%, respectively. A thin protective layer, 35 nm thick, (thickness $\ll \lambda/(4n_2)$) with a measured reflectivity of 29% was deposited on the back facet. The intensity ratio (Curve 53) characterizes the relation between the external optical intensities at the front facet after and before coating. The differential quantum efficiency increases by 51% after facet coating.

It will be appreciated that although the specific examples above describe coating of laser facets, the invention is also useful for coating surfaces of the light-emitting devices such as light-emitting diodes and photodetectors. Although the device structures were formed in GaAs substrates with multi-layer of InP, InGaAs and GaAs, the invention should be generally applicable to III-V semiconductor materials, whether binary, ternary or quaternary, and could be applied to structures including II-VI semiconductors.

Figure 6:
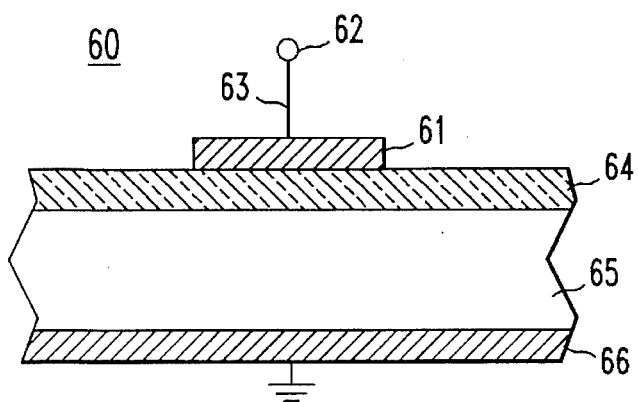
FIG. 6 is a schematic representation of a field effect device for inversion channel applications.

This invention further concerns III-V and II-VI semiconductor electronic devices, especially field-effect devices for inversion channel applications and passivation of states on exposed surfaces of electronic devices. FIG. 6 is a schematic representation of a field effect device, 60, for inversion channel applications comprising means to apply a control voltage or bias to a metal field plate 61 including electrical terminal 62 and conductor 63. A dielectric thin film 64 comprises a uniform, homogeneous, dense, dielectric $Ga_2O_3$ layer deposited ex situ or in situ by electron-beam evaporation of a single crystal, high purity $Gd_3Ga_5O_{12}$ complex compound. The term in situ (in contrast to ex situ) characterizes the deposition of said dielectric $Ga_2O_3$ thin film on a MBE grown semiconducting layer without leaving the UHV environment. The method for depositing said dielectric $Ga_2O_3$ thin film is as described above and is as disclosed in the copending U.S. application Ser. No. 08/217,296 filed on Mar. 23, 1994 (Hunt, N.E.J. et al Case 5-1-24-38), which is incorporated herein by reference. The III-V semiconductor 65 is of weak n-type or of weak p-type for p-inversion channel and n-inversion channel applications, respectively. An Ohmic contact 66 completes the circuit. The operation principles of such devices are well known from Si-MOSFET technology and consequently, are not discussed in detail (see, for example, S. M. Sze, "Physics of semiconductor devices", John Wiley & Sons, page 366, New York 1981).

Figure 7:
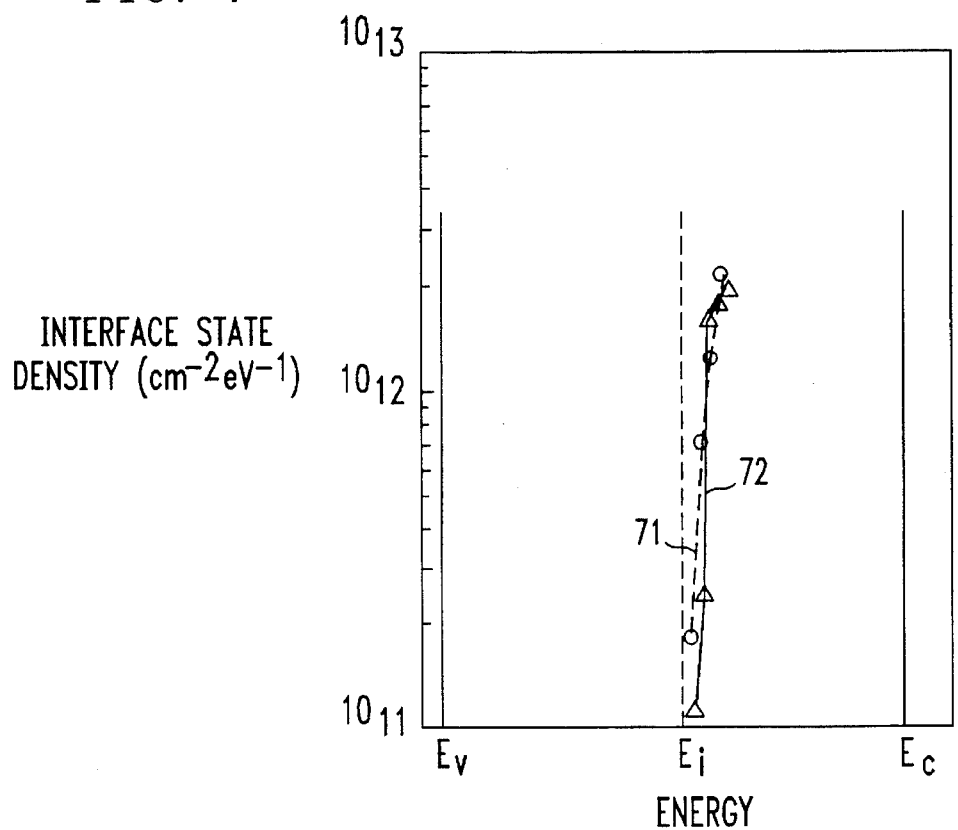
FIG. 7 is a plot of interface state density vs. bandgap energy of the field-effect device illustrated in FIG. 6, produced under one type of deposition parameters.

In a particular example, the $Ga_2O_3$ thin films were ex situ deposited on bare n-type GaAs substrates by said the above described method of fabrication. The GaAs substrates were maintained during deposition at 350° C. with $O_2$ partial pressure of $2 \times 10^{-4}$ Torr in the evaporation chamber. The device was completed by fabricating Au/Ti dots 61 of different diameters (50, 100, 200, 500 μm) on top of $Ga_2O_3$ thin films 64 by evaporation through a shadow mask and by providing an Ohmic backside contact 66. High-frequency (1 MHz) capacitance voltage measurements revealed an unpinned Fermi level, excellent reproducibility of flatband voltage and no detectable flatband voltage shift. Hysteresis was very small, typically a few tens of millivolts or less. FIG. 7 is a plot of corresponding interface state density vs. bandgap energy with substrate doping concentration of $1.6 \times 10^{16} cm^{-3}$ (Curve 71), and $8.6 \times 10^{16} cm^{31 \ 3}$ (Curve 72). Interface states $D_{it}$ were not detectable below midgap by high frequency measurements using Terman's method $$D_{it}(\psi_{SO}) = \frac{C_i}{q^2} \left( \frac{dV^*}{d\psi_S} - \frac{dV}{d\psi_S} \right)_{\psi_S = \psi_{SO}}$$

where $C_i$ is the capacitance of the dielectric layer per unit area, q is the unit charge, V* and V are the measured and calculated bias points, respectively, at the same semiconductor surface potential $\psi_S = \psi_{SO}$, i.e. at identical high frequency capacitances (T. M. Terman, "An investigation of surface states at a silicon/silicon oxide interface employing metal-oxide-silicon diodes", Solid-State Elect., vol. 5, page 285 (1962)). The resolution limit of this method is about $10^{11} cm^{-2} eV^{-1}$. The midgap interface state density determined from FIG. 7 is below $10^{12} cm^{-2} eV^{-1}$.

Figure 8:
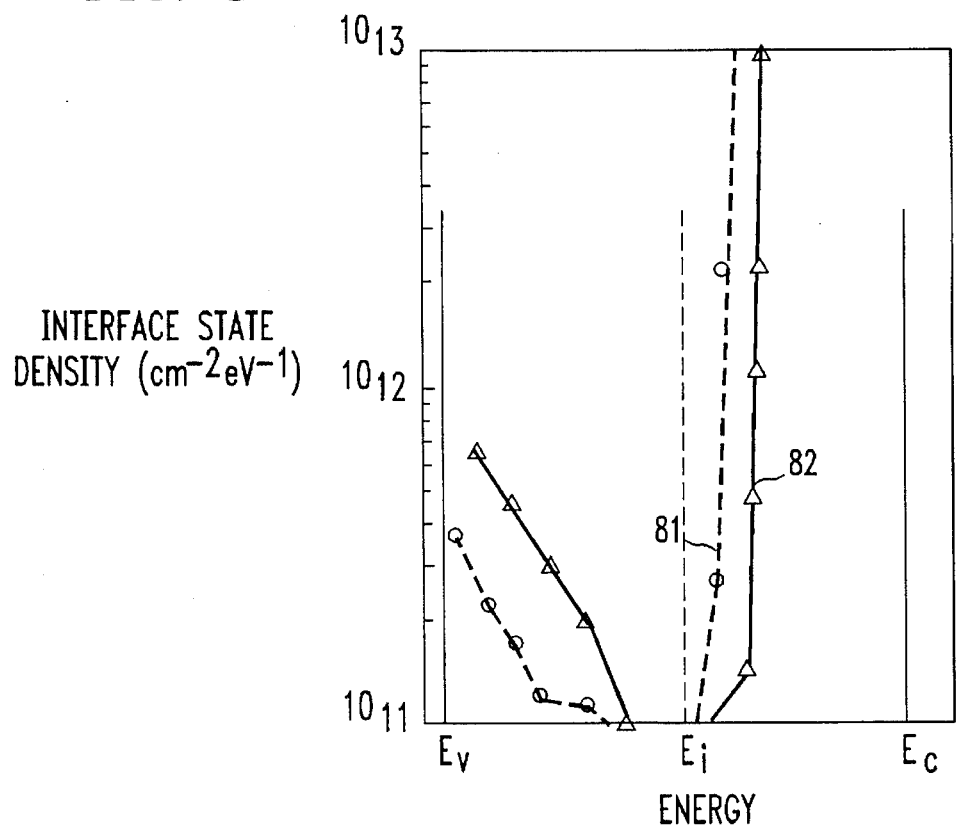
FIG. 8 is a plot of interface state density vs. bandgap energy of the field-effect device shown in FIG. 6, produced under different type of deposition parameters.

In another example, the $Ga_2O_3$ thin films were ex situ deposited on bare n-type $Ga_{0.5}In_{0.5}P$ substrates by the above described method of fabrication. The GaAs substrates were maintained during deposition at 125° C. with $O_2$ partial pressure of $2 \times 10^{-4}$ Torr in the evaporation chamber. Specific resistivity, dielectric constant and dc breakdown field of said $Ga_2O_3$ thin film are $4 \times 10^{12}$ Ωcm, 10.2, and 1.91 MV/cm. Frequency dispersion of capacitance was less than 5% below midgap within the measurement range between 500 Hz and 1 MHz. Again, high-frequency (1 MHz) capacitance voltage measurements revealed an unpinned Fermi level, excellent reproducibility of flatband voltage and no detectable flatband voltage shift. Hysteresis was very small, typically a few tens of millivolts or less. FIG. 8 is a plot of corresponding interface state density vs. bandgap energy with substrate doping concentration of $3 \times 10^{16} cm^{-3}$ (Curve 81), and $3 \times 10^{17} cm^{-3}$ (Curve 82). The midgap interface state density is well below $10^{11} cm^{-2} eV^{-1}$ and the interface state density increases toward the valence band edge to values typically found at the excellent $Si/SiO_2$ interface.

As demonstrated in both examples, the disclosed field effect device meets all requirements such as unpinned Fermi level, very low density of interface states below midgap (p-inversion channel), excellent reproducibility of flatband voltage, no detectable flatband voltage shift, small hysteresis (typically a few tens of millivolts or less), and small frequency dispersion of capacitance between 500 Hz and 1 MHz (less than 5%) for inversion channel applications.

Further, $Ga_2O_3$ thin films deposited by said fabrication method are useful for passivation of states on exposed surfaces of any kind of electronic III-V devices. The interface recombination velocity is directly proportional to the midgap interface state density. Since the demonstrated midgap interface state density is below $10^{12} cm^{-2} eV^{-1}$ and well below $10^{11} cm^{-2} eV^{-1}$ at $GaAs/Ga_2O_3$ and $Ga_{0.5}In_{0.5}/Ga_2O_3$ interfaces, respectively, the device performance and reliability are improved by small interface recombination velocities.

Various additional modifications will become apparent to those skilled in the art. All such variations which basically rely on the teachings through which the invention has advanced the art are properly considered within the scope of the invention.

We claim:

1. A process of fabricating an optoelectronic device comprising a semiconductor surface selected from the groove consisting of III-V and II-VI compound semiconductors and a coating of gallium oxide on at least a region of said surface, in which said gallium oxide is a thin film of stoichiometric $Ga_2O_3$ having low midgap interface state density, said $Ga_2O_3$ coating is deposited on said semiconductor surface by electron-beam evaporation using a high purity single crystal $Gd_3Ga_5O_{12}$ source, said semiconductor surface being kept at temperatures ranging from 40° to 370° C. and at background pressures at or above $1 \times 10^{-10}$ Torr.

2. A process of claim 1, in which said $Ga_2O_3$ thin film is deposited on said semiconductor surface at temperatures below 50° C. and a background pressure of $1-2 \times 10^{-6}$ Torr without introduction of any additional $O_2$ into the deposition chamber.

3. A process of claim 2, in which said temperature is about 40° C.

4. A process of claim 1, in which said $Ga_2O_3$ thin film is deposited on said semiconductor surface being kept at temperatures below 150° C. and with introduction of additional $O_2$ to a partial oxygen pressure of $2 \times 10^{-4}$ Torr.

5. A process of claim 1, in which said temperature is about 125° C.

6. A process of claim 1, in which said semiconductor surface is selected from the group consisting of light-emitting surfaces and light-receiving surfaces.

7. A process of claim 1, in which said device is a laser, and said $Ga_2O_3$ coating is an antireflection coating.

8. A process of claim 1, in which said antireflection coating is on one facet of the laser with the other facet being coated by alternating layers of Si and $Ga_2O_3$.

9. A process of claim 1, in which said $Ga_2O_3$ coating is on the semiconductor surface of a device selected from the group consisting of light emitting diodes and photodetectors.

10. A process of claim 1, in which said coating is deposited with an interlace state density near the midgap in the range from $1 \times 10^{13}$ to $7 \times 10^{11} cm^{-2} eV^{-1}$.

11. A process of claim 1, in which said device is a field effect device for inversion channel applications on III-V and II-VI compound semiconductors, said device comprising a semiconductor body, a $Ga_2O_3$ layer on the body and electrodes to the body and the $Ga_2O_3$ layer, said $Ga_2O_3$ layer is deposited by electron beam evaporation using a $Gd_3Ga_5O_{12}$ crystal on semiconductor substrates maintained above 125° C. with an $O_2$ partial pressure of $2 \times 10^{-4}$ Torr.

12. A process of claim 11, in which said $Ga_2O_3$ layer is deposited by electron beam evaporation using a $Gd_3Ga_5O_{12}$ crystal on GaAs substrates maintained at about 350° C. with $O_2$ partial pressure of $2 \times 10^{-4}$ Torr.

13. A process of claim 12, in which said $Ga_2O_3$ layer demonstrates a midgap interface state density below $1 \times 10^{12} cm^{-2} eV^{-1}$.

14. A process of fabrication of an electronic device comprising a semiconductor body selected from the group consisting of III-V and II-VI semiconductors, a dielectric layer on the body and electrodes to the body and the dielectric layer, wherein said dielectric layer is stoichiometric $Ga_2O_3$ demonstrating a midgap interface density below $1 \times 10^{12} cm^{-2} eV^{-1}$, and wherein said $Ga_2O_3$ layer is deposited by electron beam evaporation using a $Gd_3Ga_5O_{12}$ crystal on semiconductor substrates maintained above 125° C. with an $O_2$ partial pressure of of $2 \times 10^{-4}$ Torr.

15. A process of claim 14, in which said device is a field effect device for inversion channel applications on III-V and II-VI compound semiconductors, said device comprising a semiconductor body, a $Ga_2O_3$ layer on the body and electrodes to the body and said $Ga_2O_3$ layer is deposited by electron beam evaporation using the $Gd_3Ga_5O_{12}$ crystal on semiconductor substrates maintained above 125° C. with an $O_2$ partial pressure of $2 \times 10^{-4}$ Torr.

16. A process of claim 14, in which said $Ga_2O_3$ layer is deposited on GaAs substrates maintained at 350° C.

* * * * *